United States Patent [19]

Todd et al.

[11] Patent Number: 4,767,047
[45] Date of Patent: Aug. 30, 1988

[54] DESOLDERING DEVICE

[75] Inventors: Richard I. Todd, Chelmsford; Robert C. Claydon, Maldon, both of United Kingdom

[73] Assignee: The General Electric Company, p.l.c., London, United Kingdom

[21] Appl. No.: 8,000

[22] Filed: Jan. 29, 1987

[30] Foreign Application Priority Data

Feb. 1, 1986 [GB] United Kingdom ............... 8602504
Jul. 15, 1986 [GB] United Kingdom ............... 8618240

[51] Int. Cl.$^4$ ........................... B23K 3/00; B23K 3/04
[52] U.S. Cl. ................................... 228/6.2; 228/56.5; 228/191; 228/264
[58] Field of Search ............... 228/6.2, 20, 43, 44.7, 228/45, 56.5, 180.1, 180.2, 191, 264

[56] References Cited

U.S. PATENT DOCUMENTS

| | | | |
|---|---|---|---|
| 3,731,867 | 5/1973 | Frisbie et al. | 228/6.2 |
| 4,295,596 | 10/1981 | Doten et al. | 228/180.2 |
| 4,426,571 | 1/1984 | Beck | 228/20 |
| 4,552,300 | 11/1985 | Zovko et al. | 228/20 |
| 4,605,152 | 8/1986 | Fridman | 228/6.2 |
| 4,610,388 | 9/1986 | Koltuniak et al. | 228/6.2 |
| 4,620,659 | 11/1986 | Holdway | 228/191 |
| 4,659,004 | 4/1987 | Fridman | 228/6.2 |

*Primary Examiner*—Nicholas P. Godici
*Assistant Examiner*—Samuel M. Heinrich
*Attorney, Agent, or Firm*—Spencer & Frank

[57] ABSTRACT

A device for removing a component from a substrate to which it is secured by solder. The device has a moveable member which defines a space to which suction can be applied. The space has an opening which can be positioned against the component so as to hold the latter to the moveable member by suction. Provision is made for applying heat to the solder to soften it. The moveable member is arranged such that the suction causes it to pull the component so as to remove it from the substrate when the solder is molten.

8 Claims, 4 Drawing Sheets

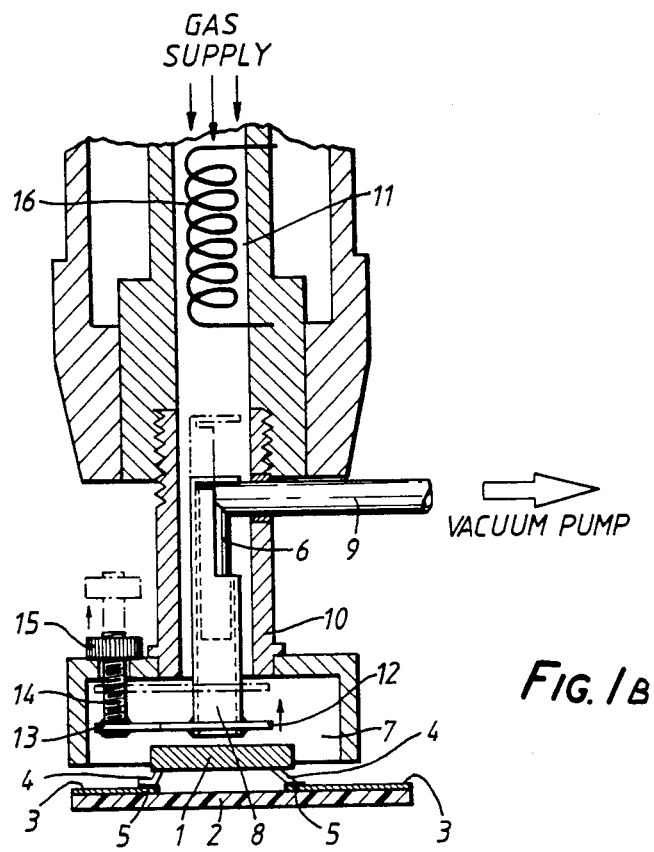
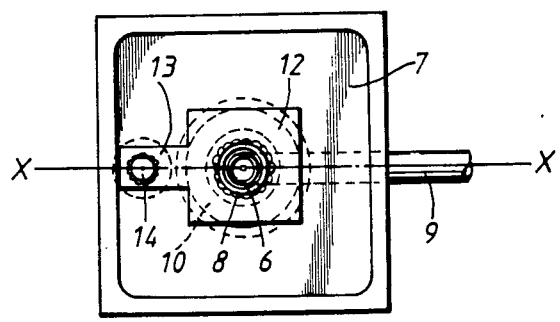
FIG. 1B
FIG. 1A

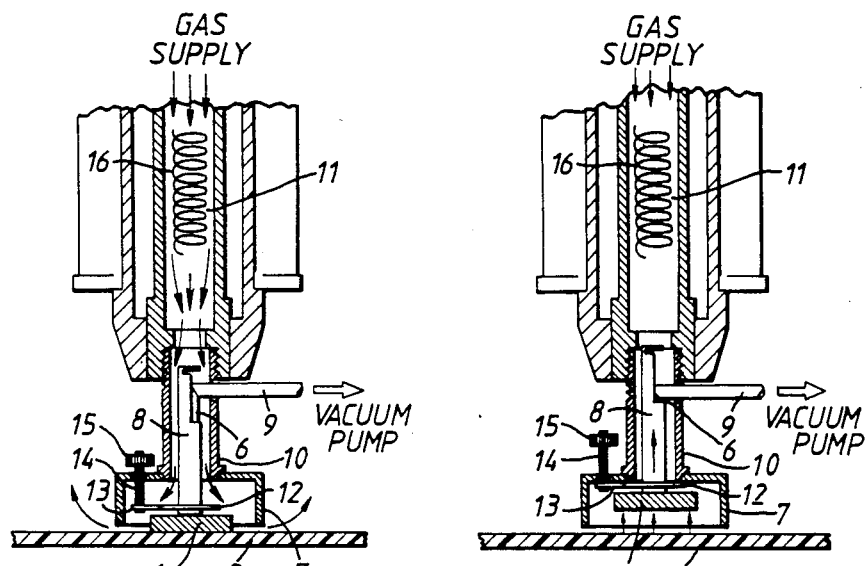
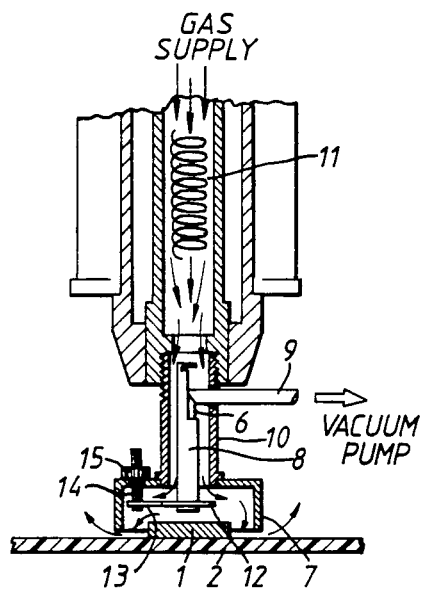

DESOLDERING DEVICE

FIELD OF THE INVENTION

This invention relates to a soldering device which is suitable for the removal and replacement of components which are secured to a substrate by means of solder.

DESCRIPTION OF THE PRIOR ART

Solder is currently the most commonly used way of mounting electrical components on an electrical circuit, but it can be difficult and tedious to remove a defective component and to replace it.

It has been proposed to utilize a suction device operating under a partial vacuum to engage with a component so that when the solder is melted by means of hot gas or the like withdrawal of the suction device is accompanied by removal of the component. Customarily the withdrawal of the suction device is achieved manually or by means of a spring. Both techniques have their drawbacks as the manual method requires the intervention of an operator and the other method requires the careful adjustment (usually manually) of the spring tension. Also, these known techniques require that the aperture for directing hot gas onto the solder joints fit precisely on to the component to be removed, so that different apertures need to be fitted to the hot gas device for each type of component and, in operation, the hot gas device must be very accurately positioned with respect to the component to be removed.

BRIEF SUMMARY OF THE INVENTION

According to this invention a device for removing a component from a substrate to which it is secured by solder including a moveable member defining a space to which suction can be applied, the space having an opening which can be positioned against the component so as to hold the latter to the moveable member by suction; and means for applying heat to the solder to soften it, the moveable member being arranged such that the suction causes it to pull the component so as to remove it from the substrate when the solder is molten.

Preferably the enclosure includes a separable skirt portion which in operation encircles the component to be removed from the substrate.

Preferably said moveable nozzle forms part of one tube which is partially slidable within another tube mounted such that when suction is applied to the nozzle via this other tube the said one tube will tend to move towards the other tube. Of course this could be achieved in other ways, for example, by applying the suction to the nozzle via a bellows.

It is desirable to combine in a single step the removal of the component from the substrate with the release of the solder by means of which the component is secured to the substrate. The invention is particularly suitable for the removal of so called surface mounted components from printed circuit boards. The term printed circuit board is used herein in a general sense to encompass any electrically insulating substrate which carries localised electrically conductive regions on a major surface thereof. Components are attached to a printed circuit board either by elongate legs which pass through apertures in the board and are secured by means of solder to conductive regions on the reverse face of the board or by conductive pads or leads which are soldered to conductive regions located on the same side of the board as, and adjacent to, the component. The latter method is termed surface mounting, and it is for components so mounted that the invention is most usefully applicable.

The degree of suction required will of course depend on the weight of the component, the nozzle diameter and the quality of the seal between the nozzle and the component. In practice, the electrical components are small and light, and so a small vacuum pump will typically be quite sufficient. Once a component has been removed from the printed circuit board, a replacement component can be positioned in its place, and secured to the electrically conductive region by using the hot air directed to melt solder around the conductive pads or leads of the component.

BRIEF DESCRIPTION OF THE DRAWINGS

The invention is further described, by way of example, with reference to the following drawings, in which:

FIG. 1 shows a cut away view, and sectional elevation through line X—X of the cut away view of an embodiment of the device, FIGS. 2 and 3 shows stages in the removal of a component from a printed circuit board using this embodiment, FIG. 4 shows the replacement of a component using this embodiment.

Similar parts have the same reference numerals throughout.

DETAILED DESCRIPTION

Figure 5:
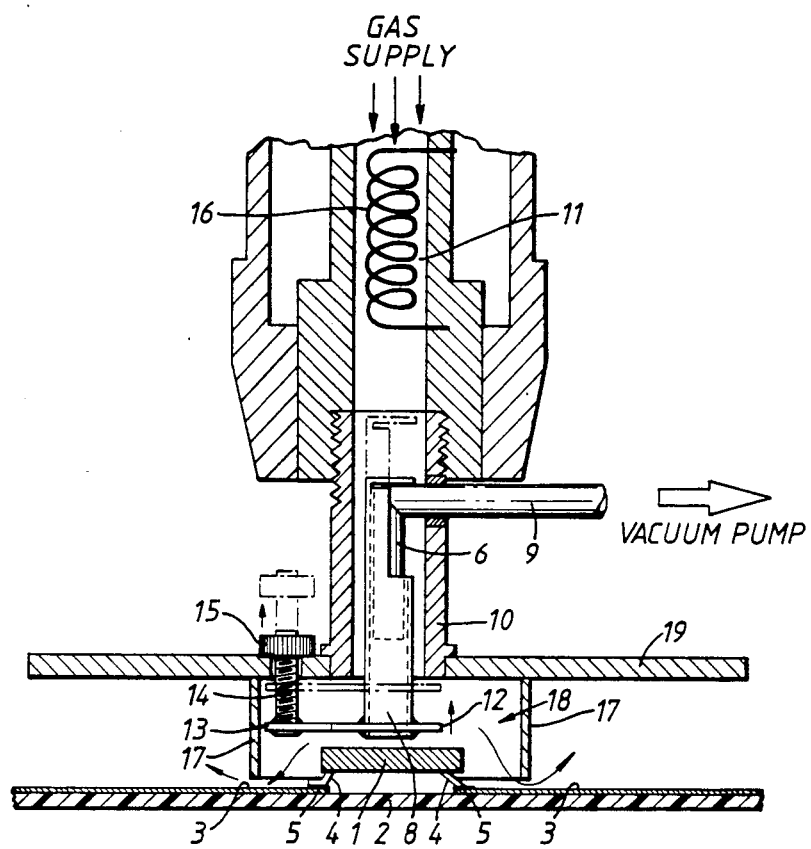
FIG. 5 shows a cut away view of an alternative embodiment of the invention.

A device for removing a component from a printed circuit board is shown in FIG. 1. A component 1 to be unsoldered is shown mounted on a printed circuit board 2. The printed circuit board carries localised conductive regions 3 to which leads 4 forming part of the component 1 are secured by means of solder 5. Although the illustrated component 1 has projecting leads, it may instead be provided with integral conductive pads. The fixed tube 6 is open-ended and is made of stainless steel with an internal diameter of 2.3 mm and an external diameter of 3.0 mm. The device is provided with an enclosure 7 which surrounds two concentric tubes 6 and 8. Tube 8 is slidably mounted around tube 6 which is connected to a vacuum pump (not shown) by means of a further tube 9. Tube 9 is rigidly fixed where it travels through the wall of a hot gas duct 10. Tube 6 is co-axial with hot gas duct 10. The sliding tube 8 is made from stainless steel with an internal diameter of 3.2 mm. Tube 8 has an open lower end and a semi-circular section cut from its upper end in order to allow it to slide over fixed tube 6 despite the fixed tube 9 projecting at right angles. The extreme upper part of tube 8 is bent over such that the bent over part and the bottom of the semi-circular cut away section define the lower and upper limits of the movement of sliding tube 8 respectively.

The sliding surfaces of tubes 6 and 8 are smooth enough to allow sliding tube 8 to slide over fixed tube 6 under its own weight while forming an adequate vacuum seal.

The hot gas duct 10 carries hot gas, preferentially hot Nitrogen, from a heating unit 11 which includes a heating element 16 over which the gas is constrained to flow around the concentric tubes 6 and 8 and down into the enclosure 7. Hot gas duct 10 is made of stainless steel with an internal diameter of 7.0 mm to allow enough room for the gas to pass. The enclosure 7 is made from stainless steel with internal dimensions 22mm×22 mm×7 mm and is attached to the end of the hot gas duct 10 and confines the hot gas around the component 1. A baffle plate 12 is fixed to the end of the sliding tube 8 in order to reduce the thermal shock to the component 1 to be removed. Baffle plate 12 is made from a thin sheet of stainless steel and is slightly larger than the bore of the hot gas duct 10. One side of baffle plate 12 extends outwards to form a tongue 13 to which a vertical threaded rod 14 of stainless steel is connected. This threaded rod 14 protrudes through a hole in enclosure 7 and is fitted with an internally threaded brass nut 15. When the nut 15 is at the upper end of rod 14 it does not restrict the movement of the sliding tube 8, but when the nut 15 is at the lower end of rod 14 it holds sliding tube 8 in its highest possible position.

Obviously the device could be made from a wide range of materials, provided said materials can withstand the temperature of the hot gas and the invention could be embodied in other ways, for example, having the sliding tube inside the fixed tube, or using a bellows instead of sliding concentric tubes, or not having the baffle plate 5 and associated parts.

Operation of the invention will now be described with reference to FIGS. 2 to 4. With reference to FIG. 2, to unsolder and remove the component, the nut 15 is left in its normal position at the top of the threaded rod 14 and the device is placed so that the component 1 to be removed is inside and approximately in the centre of the enclosure 7. The enclosure 7 does not seal with the printed circuit board 2 because a gap must be left to allow circulation of the hot gas past the component 1. The sliding tube 8 drops down under its own weight so that its lower end rests on the top of the component 1. The hot gas supply and vacuum pump are then switched on, and the period for which hot gas is supplied, approximately 20 seconds, is controlled by a timer to prevent over-heating the component and to ensure duplicability of the procedure. When the solder 5 melts, the component 1 is automatically lifted clear of the printed circuit board 2 as shown in FIG. 3, by virtue of the suction effect exerted by the vacuum pump; the operator knows when this occurs because nut 15 and threaded rod 14 will rise with the sliding tube 8, providing a visual indication. In practice, if sealing in the system is inadequate, it may be found necessary to switch on the vacuum pump whilst the solder is still molten, but after the timed "pulse" of hot gas has finished in order to prevent loss of hot gas into the vacuum system. In practice, when a number of surface mounted components with varying size and outline are closely spaced on a substrate, it can be useful for the enclosure 7 to be removeable from the device, so that alternative configurations or sizes of enclosure can be used.

Replacement of an electronic component is shown in FIG. 4. The component 1 is placed at the correct point on the printed circuit board 2 so that the conductive pads 4 align with the conductive regions 3. Solder is applied to either the component 1 or the printed circuit board 2 or both, usually prior to component placement. The nut 15 is tightened up on the threaded rod 14 and so holds the sliding tube 8 clear of the component 1. The device is placed so that the component to be soldered is inside and approximately in the centre of the enclosure 7. The hot gas supply only is then switched on and is allowed to heat the component until the solder 5 at the joints between component 1 and the printed circuit board 2 melts, forming the required joints.

A device having an alternative form of enclosure is shown for removing a component from a printed circuit board in FIG. 5. Where appropriate the same reference numerals are used as in FIG. 1. The component 1 to be unsoldered is shown mounted on the printed circuit board, as before.

Figure 6:
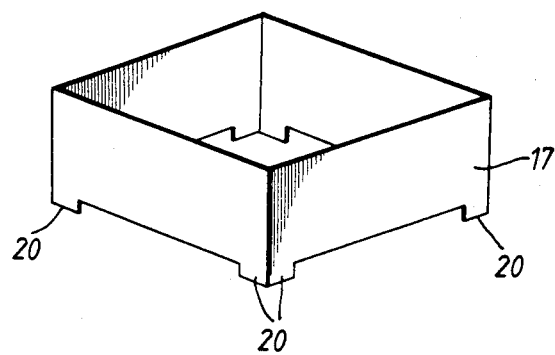
FIG. 6 shows a further view of this alternative embodiment of the invention.

The hot gas duct 10 carries the hot gas from the heating unit 11 which includes a heating element 16 over which the gas is constrained to flow around the concentric tubes 6 and 8 and down into the enclosure 18 which in this embodiment is formed by open ended skirt 17 and platen 19. Platen 19 is attached to the end of hot gas duct 10 so that it has a fixed position with respect to the tubes 6 and 9 and is a flat square stainless steel plate having an area greater than any component it will be required to unsolder or resolder. The skirt 17, shown in FIG. 6, is formed with a rectangular shape and size such that it completely encircles a component leaving enough room for hot gas from duct 10 to flow around the component. The contact between platen 19 and skirt 17 is not completely gas tight but the seal is good enough to ensure that most gas from gas duct 10 flows over the component 1 and out under the raised edges of the skirt 17 through spaces formed by lugs 20.

Although the rectangular skirt can fit around a range of sizes of components it will generally be convenient, especially in circuit boards with dense component packing, to have a number of different sized and shaped skirts so as to provide a close fit for each size of component.

In practice, if a number of components are to be removed from the same printed circuit board, a separate skirt 17 is placed around each component, and the platen 19 placed on the upper rim of each skirt in turn whilst that component is removed. In this way a large number of components can be easily and quickly removed without damaging adjacent components.

Figure 7:
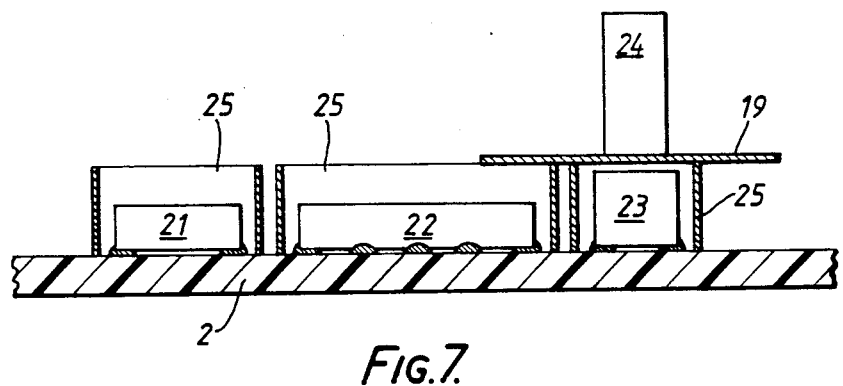

Such an arrangement is illustrated in FIG. 7, in which the printed circuit board 2 carries three components 21, 22, 23. All three components are to be removed in turn by the device, shown diagramatically at 24, and each component is provided with its own skirt 25 which completely encircles it. The platen 19 of the device 24 is brought into contact with the upper rim of each skirt in turn, and the component removed in accordance with the previously described mode of operation.

We claim:

1. A device for removing a component from a substrate to which it is secured by solder including a moveable member defining a space to which suction can be applied, the space having an opening which can be positioned against the component so as to hold the latter to the moveable member by suction; and means for applying heat to the solder to soften it, the moveable member being arranged such that the suction causes it to pull the component so as to remove it from the substrate when the solder is molten.

2. A device according to claim 1 in which the means for applying heat includes an enclosure surrounding the moveable member and means for directing hot gas into the enclosure to soften the solder.

3. A device as claimed in claim 2 and wherein the enclosure includes a separable skirt portion which in operation encircles the component which is to be removed from the substrate.

4. A device as claimed in claim 3 and wherein the enclosure includes a flat platen adapted to co-operate with an upper rim of the skirt.

5. A device as claimed in claim 2 and wherein the enclosure is dimensioned so as to surround the component.

6. A device as claimed in claim 2 and wherein a baffle is mounted within said enclosure to prevent hot gas from being directed directly onto the component.

7. A device as claimed in claim 1 and wherein a visual indicator is provided to show when said component is lifted clear of said substrate.

8. A device as claimed in claim 1 and wherein the nozzle is arranged to automatically retract, and to thereby lift the component from the substrate as the solder melts.

* * * * *